United States Patent
Rolandi

(10) Patent No.: US 7,649,773 B2
(45) Date of Patent: Jan. 19, 2010

(54) ROW SELECTOR CIRCUIT FOR ELECTRICALLY PROGRAMMABLE AND ERASABLE NON VOLATILE MEMORIES

(75) Inventor: Paolo Rolandi, Voghera (IT)

(73) Assignee: STMicroelectronics, S.r.l., Agrate Brianza (IT)

( * ) Notice: Subject to any disclaimer, the term of this patent is extended or adjusted under 35 U.S.C. 154(b) by 0 days.

(21) Appl. No.: 12/244,717

(22) Filed: Oct. 2, 2008

(65) Prior Publication Data
US 2009/0027965 A1 Jan. 29, 2009

Related U.S. Application Data

(62) Division of application No. 11/504,539, filed on Aug. 14, 2006, now Pat. No. 7,447,103.

(30) Foreign Application Priority Data
Aug. 12, 2005 (IT) ................. MI05A1578

(51) Int. Cl.
*G11C 16/00* (2006.01)
(52) U.S. Cl. ................. 365/185.05; 365/185.23; 365/230.06
(58) Field of Classification Search ............. 365/185.02
See application file for complete search history.

(56) References Cited

U.S. PATENT DOCUMENTS

| 4,720,816 | A | * | 1/1988 | Matsuoka et al. | ...... 365/230.06 |
| 4,757,478 | A | * | 7/1988 | Ducourant et al. | ..... 365/230.06 |
| 5,619,450 | A | * | 4/1997 | Takeguchi | ............... 365/185.23 |
| 6,545,923 | B2 | * | 4/2003 | Sim et al. | ............. 365/230.06 |
| 7,203,124 | B2 | * | 4/2007 | Kim et al. | ............. 365/230.06 |
| 7,289,387 | B2 | * | 10/2007 | Lee et al. | ................ 365/230.06 |

* cited by examiner

*Primary Examiner*—Tan T. Nguyen
(74) *Attorney, Agent, or Firm*—Kevin D. Jablonski; Graybeal Jackson LLP

(57) ABSTRACT

The invention relates to a row decoder circuit for non volatile memory devices of the electrically programmable and erasable type, for example of the Flash EEPROM type having a NOR architecture. The proposed row decoder circuit allows to carry out the erasing step very quickly, for example with a granularity emulating at least 16 kB and even overcoming by at least 2 kB Flash memories of the NAND type. The memory can thus maintain high performances in terms of random access speed but shows a high erasing speed typical of memory architectures of the NAND type.

19 Claims, 4 Drawing Sheets

ROW SELECTOR CIRCUIT FOR ELECTRICALLY PROGRAMMABLE AND ERASABLE NON VOLATILE MEMORIES

PRIORITY CLAIM

The present application is a Divisional of U.S. patent application Ser. No. 11/504,539, filed Aug. 14, 2006, now U.S. Pat No. 7,447,103 which claims the benefit of Italian Patent Application Serial No. MI2005A 001578, filed Aug. 12, 2005; all of the foregoing applications are incorporated herein by reference.

TECHNICAL FIELD

An embodiment of the present invention relates to a row decoder circuit for electrically programmable and erasable non volatile memories being monolithically integrated on semiconductors having at least one matrix of memory cells, organized into sectors with rows and columns of memory cells, and associated circuit portions for addressing, decoding, reading, writing and erasing the content of the memory cells, as well as a plurality of pre-decoding circuit portions, as many as the sectors of the matrix of cells, and a plurality of row decoding circuit portions, each comprising a row driver inverter final stage incorporating a complementary pair of transistors with a pull-up transistor and a pull-down transistor; a pass-transistor being provided upstream of the input of said stage to receive an output signal of the pre-decoding circuit portion.

BACKGROUND

The market of non volatile memories, for example of the EEPROM or Flash EEPROM type, is currently widely expanding and relates to the so called "data storage" area.

Until recently, this market almost exclusively involved the consumer sector of digital cameras, with the related support cards, or the known USB keys, which represent expansion portable memories for personal computers. Therefore, the request for these products by the consumer market was especially aimed at flash memories of great capacity.

This trend seems to be destined for reinforcement in the next years by virtue of the new applications which require higher and higher memory capacities, for example for applications such as those as digital cameras or for cell-phones of the most recent generation, operating according to the 3G or UMTS standard.

These applications are completely compatible with the natural evolution of flash memories if one considers that these memories are substantially mass memory units in the solid state with further advantages linked to their low power consumption, to their operational silence, to the reduced dimension etc.

PRIOR ART

As it is well known, flash-memory architectures can be substantially divided into two fundamental classes, the first of which relates to traditional and widely tested NOR architectures, while the second relates to the most innovative and promising NAND architectures.

These latter show obvious advantages with respect to NOR architectures, in particular these NAND memories are quicker in managing great amounts of data to be recovered in a synchronous way and this may make them more suitable for the use on portable electronic devices.

Since in data storage applications the need of a random access time is less important with respect to the case of "code storage" applications, the most significant feature of NOR architectures loses most of its importance to the advantage of an architecture which is able to treat, in a simple and quick way, great amounts of "synchronous" data in reading and programming.

This latter feature is typical of the architectures of the NAND type which, however, associate this feature also with a greater flexibility in erasing, i.e., a very strong granularity, for example of 16 kB, thus being compatible with the behavior of hard disks (it is remembered that, for example, that the dimension of the clusters in hard disks is of multiples of 2 k, 4 k etc.).

To emulate a similar granularity in the erasing step, a NOR architecture may carry out such a number of operations as to make the file-managing process burdensome and particularly slow.

In fact, erasing by sectors of at least 128 kB, the NOR architecture requires the use of a temporary buffer, i.e., of a buffer memory, which allows avoiding a non-required erasing of a portion of the data, and thus allows a temporary storage of the same for a possible recovery thereof. The onus of the writing of the new data is to be added to what aforesaid.

All this does not occur if using an architecture of the NAND type.

SUMMARY

An embodiment of the present invention is a new volatile memory architecture which can combine the advantages of the NOR structure with the values of the NAND structure, and overcome the limits and drawbacks of the known solutions.

An embodiment of the present invention is a flash memory with NOR architecture, which maintains high performances in terms of random access speed, but which allows in the meantime one to carry out the erasing step just as quickly, for example with a granularity which emulates at least 16 kB and even overcomes, by at least 2 kB, the flash memories of the NAND type.

In an embodiment, this result is obtained by means of a selective erasing acting at the pre-coding level on the activation signals P, L of the pass-transistor upstream of the input of the row driver final stage; one (P) of these signals always remains active during the selective erasing step, while the other signal (L) instead manages negative voltages so as to apply a negative voltage onto the row selected by the other pre-decoder.

An embodiment of the invention is a row decoder circuit for electrically programmable and erasable non volatile memories being monolithically integrated on a semiconductor chip with at least one matrix of memory cells having a NOR structure, organized into sectors with rows and columns of memory cells, and associated circuit portions for addressing, decoding, reading, writing and erasing the content of the memory cells, as well as a plurality of pre-decoding circuit portions, as many as the sectors of the matrix of cells are, and a plurality of row decoding circuit portions, each comprising a row driver inverter final stage incorporating a complementary pair of transistors with a pull-up transistor and a pull-down transistor; a pass-transistor being provided upstream of the input of this stage to receive an output signal from a NOR gate of the pre-decoding circuit portion, wherein the row decoder circuit further comprises a pull-up stage or decoupler between the supply of the inverter final stage and the input of the same inverter final stage to apply a positive potential at the input of the inverter final stage further to negative pre-decoding signals and maintain the pull-up transistor off during the selective erasing step by means of such a decoupler as to apply a negative voltage onto the sole selected matrix rows maintaining instead the gates of the cells belonging to the rows not selected for the erasing step floating.

BRIEF DESCRIPTION OF THE DRAWINGS

Features and the advantages of a row decoder circuit according to an embodiment of the present invention will be apparent from the following description given by way of indicative and non limiting example with reference to the annexed drawings.

DETAILED DESCRIPTION

Figure 2:
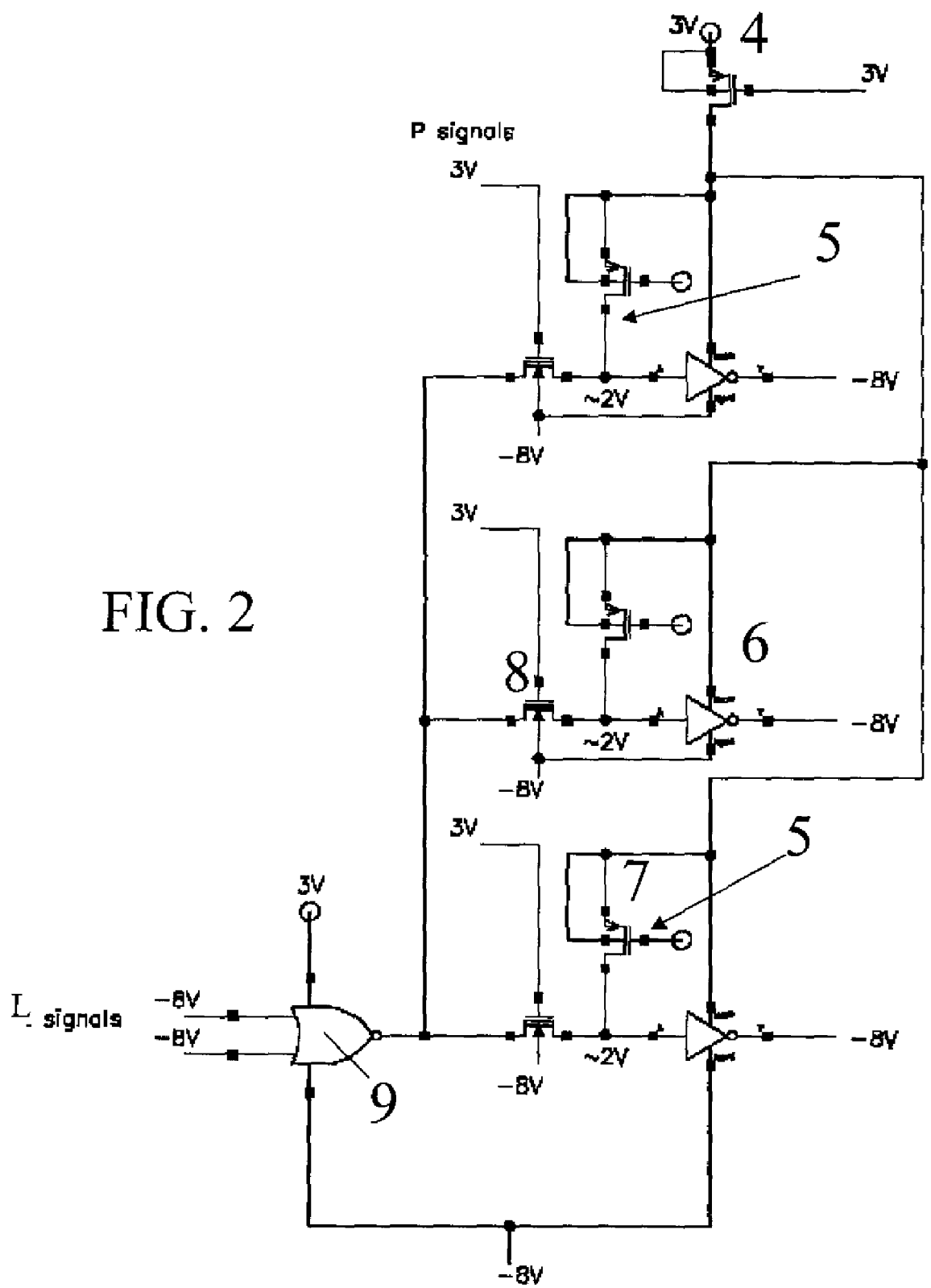
FIG. 2 is a schematic view of the decoder circuit according to an embodiment of the present invention under a first operative condition, in particular in the selective erasing step.

With reference to these figures, and in particular to the example of FIG. 2, the description will now follow of a row decoder circuit and of a relative selective erasing method made possible by an embodiment of the present invention by means of the particular row decoder circuit structure, globally indicated with 1.

The row decoder circuit 1 is incorporated in a non volatile memory electronic device of the electrically programmable and erasable type.

A memory device is a monolithic electronic system incorporating a matrix of memory cells having a NOR structure, organized into rows and columns, and circuit portions associated with the matrix of cells and dedicated to the functions of addressing, decoding, reading, writing and erasing the content of the memory cells.

A device of this kind can be for example a semiconductor-integrated memory chip of the EEPROM or non volatile flash EEPROM type divided into sectors and being electrically erasable.

Each memory cell comprises a floating gate MOS transistor with source, drain and control gate terminals.

Among the circuit portions associated with the matrix of cells the presence is provided of a row decoder circuit portion associated with each sector and supplied with positive and negative specific voltages fully generated inside the memory integrated circuit by means of boosters or charge pumps and regulated by means of corresponding voltage regulators.

An embodiment of the present invention is applied to a memory integrated device wherein the matrix sectors can be erased independently from one another by means of an erasing algorithm. An embodiment allows to carry out very quick erasing steps although maintaining, for the memory device, a structure of the NOR type.

An embodiment of the invention allows one to obtain a high granularity in the erasing step with respect to the traditional solutions based on the architectures of the NOR type emulating a mass memory as a hard disk (with granularity of about 2 kB or higher).

Figure 1:
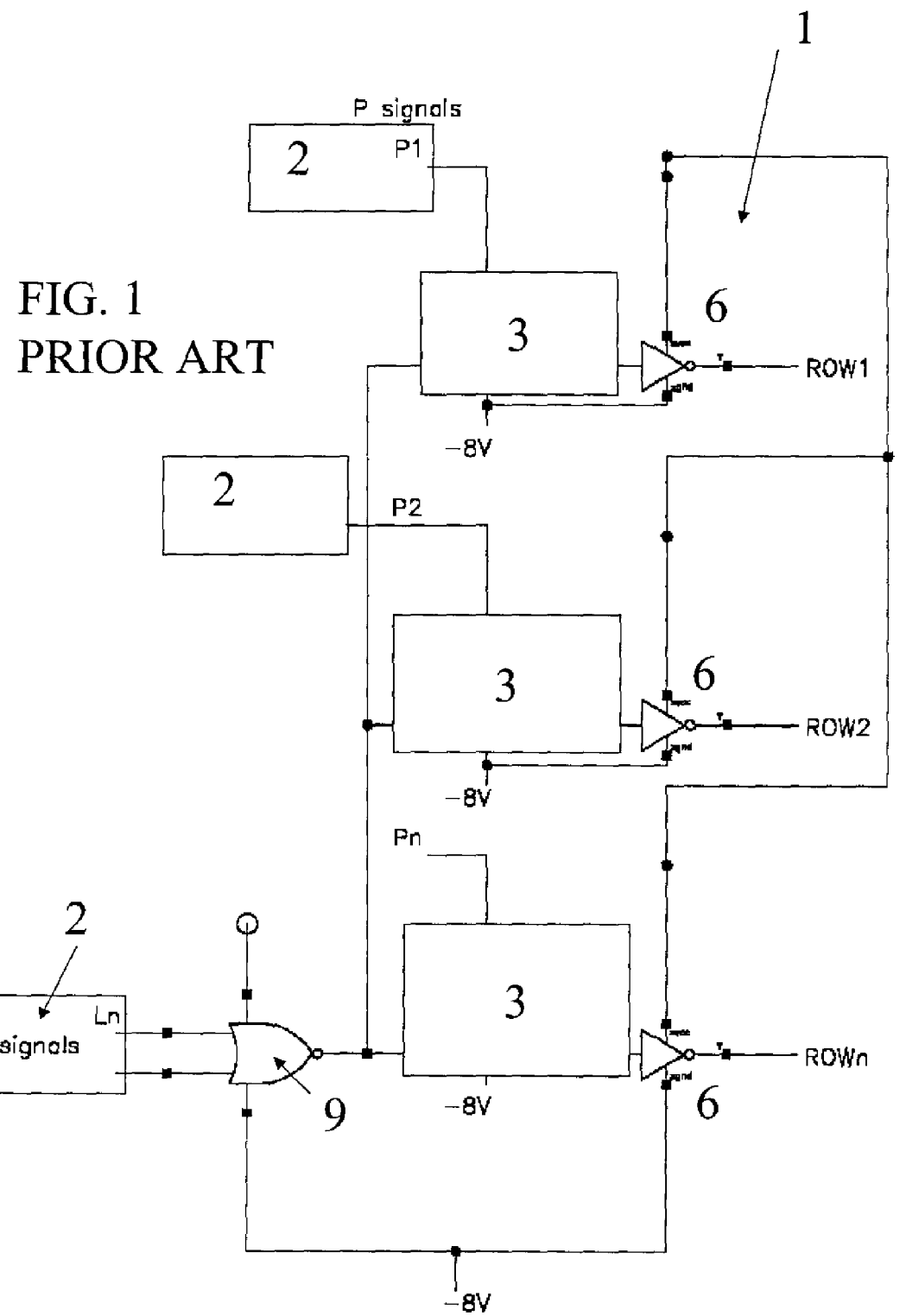
FIG. 1 is a schematic view of a row decoder circuit realized according to the prior art and associated with a matrix of electrically erasable and programmable non volatile memory cells.

This improvement is obtained by means of a selective erasing which is activated at the pre-decoding level. The blocks 2 indicate, in FIG. 1, the circuit portions dedicated to the row pre-decoding and to the generation of the P and L signals which are normally active and positive for each sector according to the teachings of the prior art.

Thus in the known structures of row decoder circuits there are two concurrent pre-decoding signals P and L.

According to an embodiment of the present invention one of these signals, for example the one indicated with P in FIG. 2, remains always active during the selective erasing step. According to an embodiment of the present invention, the other signal indicated with L has been provided for managing negative voltages so that it acts as a selector for the sole group of rows to be erased.

In this latter case all the signals L applied to the pre-decoding NOR gate corresponding to the group of rows to be erased are brought to the same negative voltage (in the example shown in FIG. 2 equal to −8V).

The number of signals L can vary from eight to sixteen in the present example according to the number of active signals P in the pre-decoder.

The unselected rows are left floating so as to be brought to a positive voltage level during the application of a positive voltage to the well or body terminal of the matrix. In substance, in the erasing step the gates of the unselected cells are brought to the same potential as the well, by effect of the capacitive coupling of the same gates with the body of the matrix and thanks to the fact that the corresponding drivers are floating.

The selective erasing method according to an embodiment of the invention avails itself of the particular conformation of the row decoder circuit 1 which comprises a plurality of pre-decoding circuit portions 2, as many as there are sectors of the matrix of cells, and corresponding row-decoder circuit portions 3.

The row decoder circuit 1 is input with a plurality of n signals P1, . . . , Pn and produces, at corresponding n outputs, driving signals for each row ROW 1, . . . , ROWn of a given sector of the matrix of memory cells.

The row decoder circuit 1 is supplied between a first supply voltage reference Vcc and a second negative supply voltage reference Vee.

Between the first supply voltage reference Vcc and the row decoder circuit 1 a selection transistor 4 in inserted in series receiving, on its own input terminal, an enable positive signal, for example of about 3V, which is activated during the selective erasing step.

Each one of the pre-decoding circuit portions 2 is supplied by the first supply voltage reference Vcc and outputs an assigned plurality n of pre-decoding signals P1, . . . , Pn.

Each one of the decoding circuit portions 3 comprises a pull-up stage or decoupler 5 which allows management of the voltages applied during the various operative steps dedicated to the selective erasing.

Each matrix row ROW1, . . . , ROWn is associated with an inverter final stage 6 which is the row driver of the row decoder circuit 1.

This final inverter stage 6 operates as transfer gate, within an embodiment of the present invention, and comprises a complementary pair of MOS transistors, namely a so called pull-up PMOS transistor and a so called pull-down NMOS transistor connected in series to each other between the first and the second negative supply voltage reference.

An enable PMOS transistor, indicated with 7, is inserted upstream of the supply of the inverter final stage 6.

This enable transistor 7 is preferably inserted in a diode configuration.

A natural pass-transistor 8 is inserted in series and upstream of the signal input of the inverter final stage 6. This pass-transistor 8 receives, on its own control terminal, an input signal P1 and, on its own body terminal, the second negative supply voltage reference Vee corresponding to the well supply of the whole matrix sector.

A gate 9 of the NOR type is provided for the selection of the group of rows to be erased; this NOR gate 9 is active in the presence of a pair of negative input signals L (for example of value equal to −8V).

The selective erasing method of an embodiment of the present invention is centered on the use of the decoder circuit 1 structure.

Figure 3:
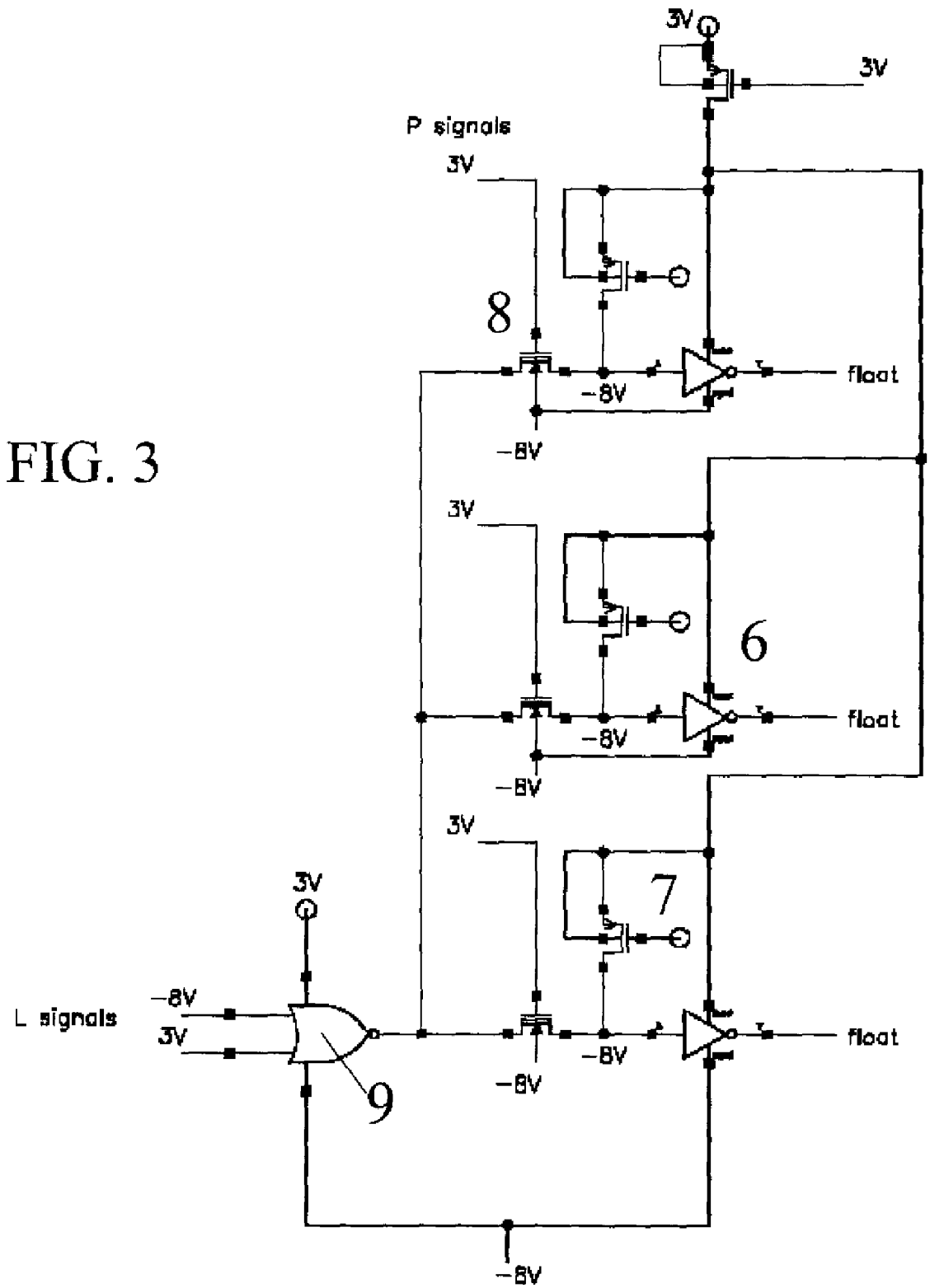
FIG. 3 is a schematic view of the circuit of FIG. 2 under the same operative condition of FIG. 2 but relative to the memory cells not selected for the erasing step according to an embodiment of the invention.

FIGS. 2 and 3 schematically show two different biasing conditions of the decoder circuit 1, in particular with rows selected for the erasing step (FIG. 2) or with rows deselected and not subjected to erasing (FIG. 3); the two figures highlight the corresponding signals applied and/or present in the circuit.

The row decoding step according to an embodiment of the present invention is particularly simple.

During the erasing step, the decoder circuit 1 is supplied by a negative supply Vee which, during the selective erasing step called "selective erase", is brought for example to −8V.

The pre-decoding circuit portions 2 are instead supplied by means of the first voltage reference Vcc and generate the positive signals P; while the other pre-decoding circuit portions manage signals L with negative voltage values (−8V).

The supply of the row driver or inverter final stage 6, and in particular of the pull-up PMOS transistor, is interrupted for the rows not selected during the operation of row selective erasing step by means of the enable PMOS transistor 7 for the reasons which will be hereafter explained.

EXAMPLE 1

Let's first analyze the case of the rows selected for the erasing step, with reference to FIG. 2.

FIG. 2 schematically shows what occurs in the decoder portion 1 connected to the rows which are to be erased.

First of all, both for the selected rows and for the unselected rows, the signals P are brought to the high logic value (for example 3V), i.e. they are all active.

By mere way of example, the case is reported of only two signals L applied to the gate 9 of the NOR type; as already said, the effective number of these signals L depends on the dimensions of the matrix.

In this case, by means of the natural pass-transistor 8, which is active due to the signals P having high logic values, a positive voltage (~2V, since it is given by: 3V-Vthbody) is brought to the input of the row driver or inverter final stage 6, wherein the pull-up PMOS portion is not supplied.

Therefore, a leakage has been created due to the enable transistor 7 which allows by-passing the pull-up transistor of the row driver or inverter final stage 6 thanks to the application of a positive voltage at the input of the inverter.

Therefore, in this row driver or inverter final stage 6 only pull-down NMOS portion operates, whose source terminal is connected to the negative voltage Vee which, in the specific case described, being the gate voltage positive, is brought to the corresponding rows or word lines of the matrix of cells.

The number of word-lines connected during such an operation depends on the type of decoding and can vary from a minimum of eight in an embodiment, in the case of a decoder with eight signals of the P type and for architectures with independent sectors, to a maximum of 16*4=64 in an embodiment, in the case of a decoder with sixteen signals P and architectures realized with blocks having common sectors.

In consequence, it is possible to appreciate the so called stronger "granularity", i.e., the minimum erasable unit, of the proposed embodiment which can be equal to up to 2 kB.

EXAMPLE 2

Let's now analyze, with the help of FIG. 3, the case of the unselected rows.

As regards the unselected rows, in the row decoder circuit portion wherein the gates 9 of the NOR type have at least on input having a high logic value, the NMOS or pull down transistor of the row driver or inverter final stage 6 has, on its own source terminal, a negative value (for example −8V) and therefore, by virtue of the fact that the PMOS portion is not supplied, the corresponding rows remain floating.

In the case of source-bulk erasing, the gate terminals of the floating cells, due to the capacitive coupling, will follow the progress of the erasing positive scale and thus the corresponding cells will not have a difference of potential being enough to allow the passage of electrons for allowing an erasing, i.e., to allow the passage of a tunneling current for emptying the floating gate.

For completing the description it is to be pointed out that the structure of the row decoder circuit 1 using NOR gates, as previously described with reference to the selective erasing operations, may not operate correctly in the reading step.

Figure 4:
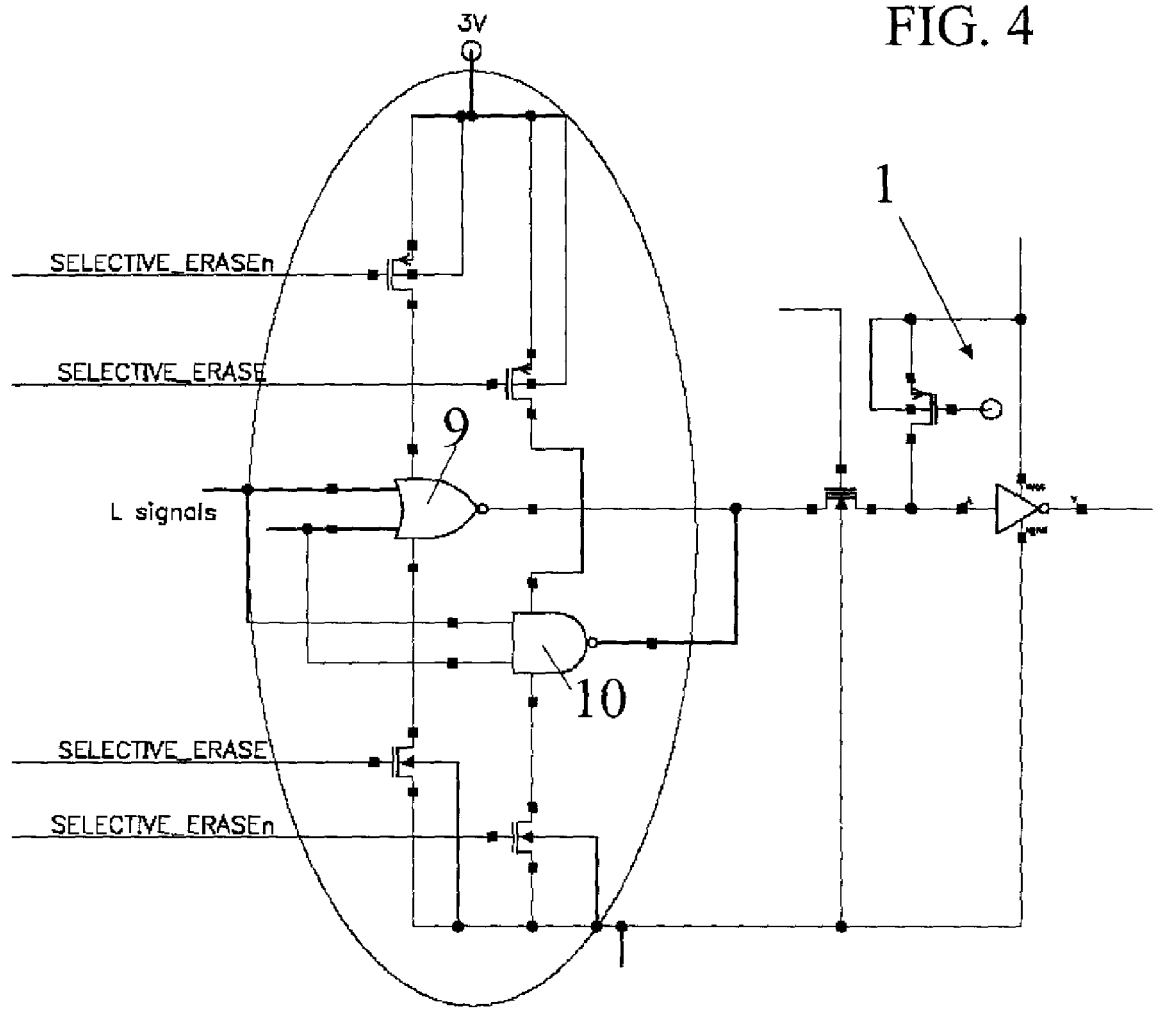
FIG. 4 is a schematic view of an additional circuit portion associated with the decoder circuit according to an embodiment of the invention.

To overcome this potential drawback the use of a simple switching circuit has been provided which allows the passage from an erasing step to a reading step by simply substituting the gate 9 of the NOR type with a gate 10 of the NAND type, as shown for example in FIG. 4.

This measure does not represent a limit of the present invention but is only a technical suggestion for obtaining a more efficient structure in the reading step.

The method and the row decoder circuit according to an embodiment of the invention solve a technical problem and attain several advantages as hereafter listed.

An embodiment of the proposed solution, as already hinted at, has the great advantage of realizing a strong erasing granularity for NOR architectures which can emulate or even overcome the granularity of the NANDs and in the meantime can exploit, at best, the access time advantages typical of the NORs.

An embodiment of the above-described row-decoder circuitry may be incorporated into an integrated circuit such as a non-volatile memory, which may be incorporated into an electronic system such as a computer system.

From the foregoing it will be appreciated that, although specific embodiments of the invention have been described herein for purposes of illustration, various modifications may be made without deviating from the spirit and scope of the invention.

What is claimed is:

1. A row selector for a row of at least one nonvolatile memory cell coupled to a word line, the row selector comprising:
    a driver having an input node operable to receive a row-select signal, an output node operable to be coupled to the word line, and a first supply node; and
    a diode coupled between the input node and first supply node of the driver and operable to allow current to flow from the first supply node to the input node.

2. The row selector of claim 1 wherein the driver comprises an inverter having input and output nodes respectively coupled to the input and output nodes of the driver.

3. The row selector of claim 1 wherein the driver comprises:
a first transistor having a control node coupled to the input node, a first conduction node coupled to the first supply node, and a second conduction node coupled to the output node;
a second supply node; and
a second transistor having a control node coupled to the input node, a first conduction node coupled to the second supply node, and a second conduction node coupled to the output node.

4. The row selector of claim 1 wherein the driver comprises:
a P-channel transistor having a gate coupled to the input node, a first source/drain region coupled to the first supply node, and a second source/drain region coupled to the output node;
a second supply node; and
an N-channel transistor having a gate coupled to the input node, a first source/drain region coupled to the second supply node, and a second source/drain region coupled to the output node.

5. The row selector of claim 1 wherein the diode comprises a diode-connected transistor.

6. The row selector of claim 1 wherein the diode comprises a P-channel transistor having a first source/drain region coupled to the first supply node, and having second source/drain region and a gate region coupled to the input node of the driver.

7. The row selector of claim 1, further comprising a pass gate operable to provide the row-select signal to the input node of the driver.

8. An integrated circuit, comprising:
a word line;
a nonvolatile memory cell coupled to the word line; and
a row selector having a selector input node operable to receive a row-select signal, a selector output node coupled to the word line, and a first selector supply node, the row selector including,
a driver having driver input and output nodes respectively coupled to the selector input and output nodes and having a driver supply node coupled to the first selector supply node, and
a diode coupled between the first selector supply node and the selector input node and operable to allow current to flow from the first selector supply node to the selector input node.

9. The integrated circuit of claim 8, further comprising a row decoder operable to receive a row-address signal and to generate the row-select signal from the row-address signal.

10. The integrated circuit of claim 8, further comprising a NOR gate operable to receive a row-address signal and to generate the row-select signal from the row-address signal.

11. The integrated circuit of claim 8, further comprising:
a NOR gate having an input node and having an output node coupled to the selector input node; and
a NAND gate having an input node coupled to the input node of the NOR gate and having an output node coupled to the selector input node.

12. The integrated circuit of claim 8, further comprising:
a NOR gate operable to receive a row-address signal and to generate the row-select signal during a first operating mode; and
a NAND gate operable to receive the row-address signal and to generate the row-select signal during a second operating mode.

13. An electronic system, comprising:
an integrated circuit, including,
a word line,
a nonvolatile memory cell coupled to the word line, and
a row selector having a selector input node operable to receive a row-select signal, a selector output node coupled to the word line, and a first selector supply node, the row selector including,
a driver having driver input and output nodes respectively coupled to the selector input and output nodes and having a driver supply node coupled to the first selector supply node, and
a diode coupled between the first selector supply node and the selector input node and operable to allow current to flow from the first selector supply node to the selector input node.

14. A method, comprising:
driving a word line to a predetermined signal level with a driver, the word line being coupled to a nonvolatile memory cell; and
preventing the driver from providing to the word line a current that opposes the predetermined signal level.

15. The method of claim 14 wherein the predetermined signal level comprises a negative voltage.

16. The method of claim 14 wherein the predetermined signal level comprises a floating level.

17. The method of claim 14 wherein preventing the driver from providing a current comprises conducting a current between a supply node and an input node of the driver.

18. The method of claim 14 wherein preventing the driver from providing a current comprises conducting with a diode a current between a supply node and an input node of the driver.

19. The method of claim 14 wherein preventing the driver from providing a current comprises conducting with a diode-connected transistor a current between a supply node and an input node of the driver.

* * * * *